(12) United States Patent
Uchiyama et al.

(10) Patent No.: US 6,334,166 B1
(45) Date of Patent: Dec. 25, 2001

(54) PROCESSOR SYSTEM USING SYNCHRONOUS DYNAMIC MEMORY

(75) Inventors: Kunio Uchiyama, Kodaira; Osamu Nishii, Kokubunji, both of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/520,834

(22) Filed: Mar. 8, 2000

Related U.S. Application Data

(62) Division of application No. 08/689,730, filed on Aug. 13, 1996, which is a continuation of application No. 08/118,191, filed on Sep. 9, 1993, now Pat. No. 5,574,876.

(30) Foreign Application Priority Data

Sep. 18, 1992 (JP) ..................................... 4-249190

(51) Int. Cl.[7] ...................................... G06F 12/02
(52) U.S. Cl. .......................... 711/105; 156/167; 156/168; 713/400
(58) Field of Search ................... 711/105, 156, 711/167, 168; 713/400

(56) References Cited

U.S. PATENT DOCUMENTS

| 4,394,753 | 7/1983 | Penzel ................................. 395/405 |
| 4,796,232 | 1/1989 | House ................................. 395/405 |
| 5,060,145 | 10/1991 | Scheuneman et al. ............. 395/425 |
| 5,243,699 | 9/1993 | Nickolls et al. ...................... 395/275 |
| 5,283,877 | 2/1994 | Gastinel et al. ....................... 711/15 |
| 5,287,327 | 2/1994 | Takasugi .......................... 365/230.02 |
| 5,339,276 | 8/1994 | Takasugi .......................... 365/230.02 |
| 5,339,399 | 8/1994 | Lee et al. ............................. 395/425 |
| 5,367,494 | 11/1994 | Shebanow et al. ............. 365/230.03 |

(List continued on next page.)

FOREIGN PATENT DOCUMENTS

| 0245882 | 11/1987 | (EP) . |
| 0339224 | 11/1989 | (EP) . |
| 0468480 | 1/1992 | (EP) . |
| 5781660 | 5/1982 | (JP) ................................ G06F/13/00 |
| 62128342 | 6/1987 | (JP) ................................ G06F/12/06 |
| 6476342 | 3/1989 | (JP) ................................ G06F/12/06 |

(List continued on next page.)

OTHER PUBLICATIONS

L. Johnson et al., "System Level ASIC Design For Hewlett–Packard's Low Cost PA–RISC Workstations", International Conference of Computer Design Proceedings, pp. 132–133, 1991.
Hitachi IC Memory Handbook 2, DRAM, DRAM Module, 389–393, 1991.
Nikkei Electronics, 1992, pp. 143–147.
Speed System Memory by Interleaving DRAM Acceses, 2326 Electronic Design, 37, 1989, No. 21, Cleveland, Ohio.
Nikkei Electronics, No. 553, pp. 143–147, May 11, 1992 (English language translation).

(List continued on next page.)

Primary Examiner—Hiep T. Nguyen
(74) Attorney, Agent, or Firm—Antonelli, Terry, Stout & Kraus, LLP

(57) ABSTRACT

A main storage apparatus is a synchronous dynamic memory having a plurality of memory banks and a mode register for determining an operation mode, a main storage controller is coupled to a processor and the main storage apparatus, and means to realize controlling of parallel access to a plurality of banks of the memory and controlling of setting of an operation mode to the built-in register is arranged in the main storage controller. Accordingly, the use of a conventional processor of high generality and a conventional memory can be ensured.

37 Claims, 11 Drawing Sheets

U.S. PATENT DOCUMENTS

| | | | |
|---|---|---|---|
| 5,371,896 | | 12/1994 | Gove et al. ............................ 391/800 |
| 5,432,823 | * | 7/1995 | Gasbarro et al. ..................... 375/356 |
| 5,574,876 | | 11/1996 | Uchiyama et al. ................... 395/405 |
| 5,657,481 | * | 8/1997 | Farmwald et al. ................... 713/400 |

FOREIGN PATENT DOCUMENTS

| | | | |
|---|---|---|---|
| 315956 | 1/1991 | (JP) | ................................ G06F/12/06 |
| 3238539 | 10/1991 | (JP) | ................................ G06F/12/06 |

OTHER PUBLICATIONS

N. Mekhiel, "Speed System Memory By Interleaving DRAM Accesses DRAM Performs at SRAM Speeds To Keep Up With A 33.Mhz 68030 Running In Burst Mode", Electronic Design, vol. 37, No. 21, Oct. 12, 1989, pp. 65–68, 70, 72.

D. Bursky, "80×86–Compatible Family Outperforms Original CPUs", Electronic Design, vol. 39, No. 18, Sep. 26, 1991, pp. 53–56, 61.

* cited by examiner

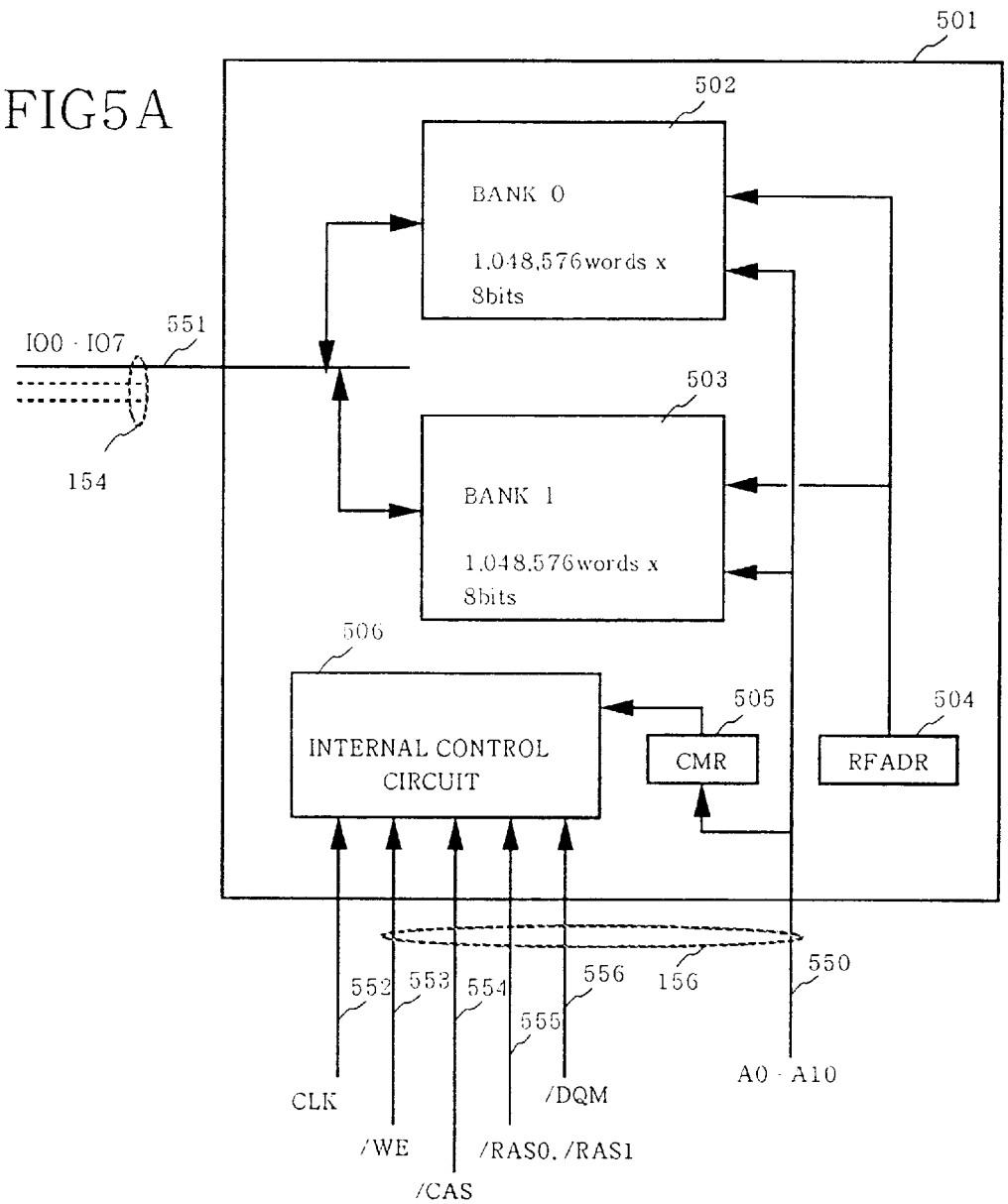
FIG5A
FIG5B
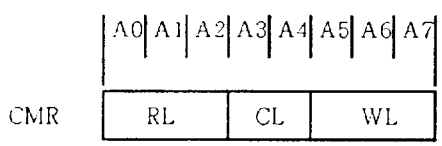
| | A0 | A1 | A2 | A3 | A4 | A5 | A6 | A7 |
|---|---|---|---|---|---|---|---|---|
| CMR | RL | | | CL | | WL | | |
RL FIELD
| A0 | A1 | A2 | /RAS DELAY |
|---|---|---|---|
| 0 | 0 | 1 | 1 |
| 0 | 1 | 0 | 2 |
| 0 | 1 | 1 | 3 |
| 1 | 0 | 0 | 4 |
| 1 | 0 | 1 | 5 |
CL FIELD
| A3 | A4 | /CAS DELAY |
|---|---|---|
| 0 | 1 | 1 |
| 1 | 0 | 2 |
| 1 | 1 | 3 |
WL FIELD
| A5 | A6 | A7 | WRAP LENGTH |
|---|---|---|---|
| 0 | 0 | 0 | 4 |
| 0 | 0 | 1 | 8 |
| 1 | 0 | 0 | 32 |
| 1 | 1 | 1 | Full |

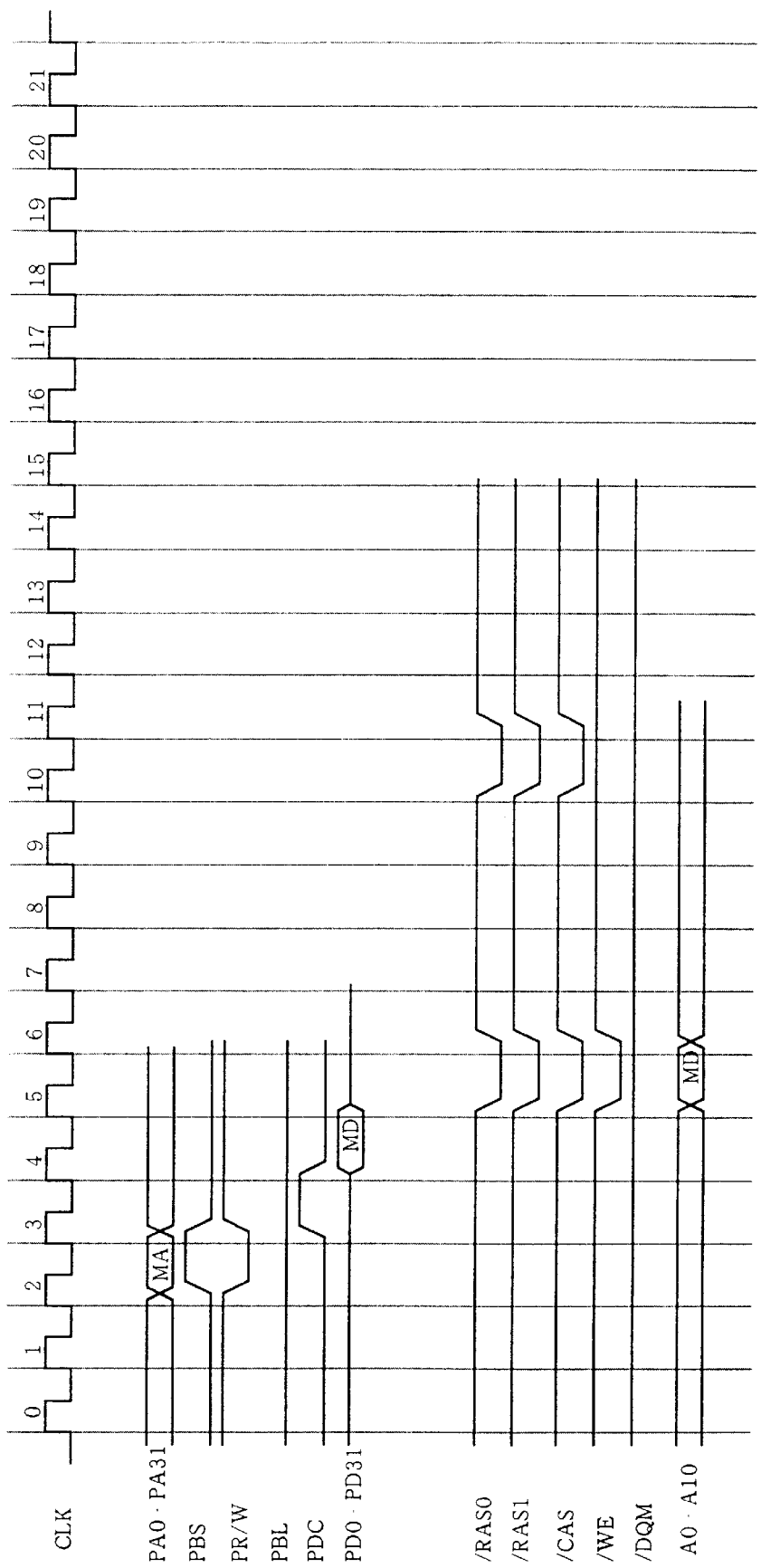

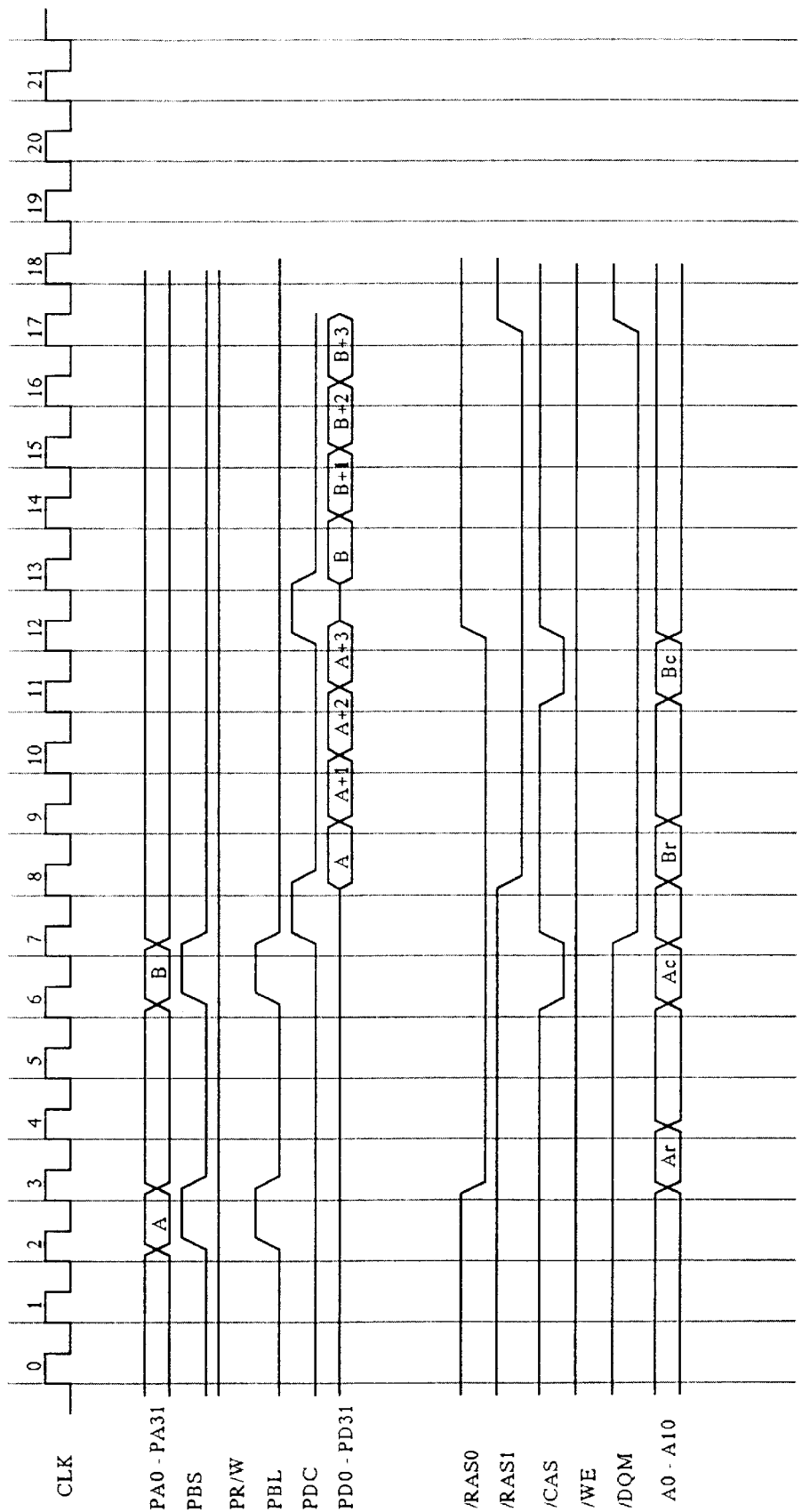

PROCESSOR SYSTEM USING SYNCHRONOUS DYNAMIC MEMORY

This is a divisional of application Ser. No. 08/689,730, filing date Aug. 13, 1996, pending, which is a continuation of parent application Ser. No. 08/118,191, filing date Sep. 9, 1993 patented as U.S. Pat. No. 5,574,876.

BACKGROUND OF THE INVENTION

The present invention relates to a processor system in which a synchronous dynamic memory is used in a storage apparatus for storing data or instructions.

In a conventional processor system, the main storage apparatus for storing data or instructions has been constructed by using a cheap, general purpose dynamic memory. An example of a general architecture of the main storage apparatus of a work station using a plurality of dynamic memories can be seen in, for example, L. Johnson et al., "System Level ASIC Design for Hewlett-Packard's Low Cost PA-RISC Workstations", ICCD '91,International Conference on Computer Design, Proceeding, pp. 132–133.

Specifications of such a general purpose dynamic memory are seen in Hitachi IC Memory Handbook 2, "DRAM, DRAM Module"('91.9), pp.389–393. As will be seen from the above, the conventional dynamic memory does not have a clock input which serves as an input signal to a chip and during read/write, an internal operation clock was generated in the chip from other control input signals. Furthers a mode register for prescribing the operation mode of the dynamic memory was not provided therein and as a consequence, the operation mode of the conventional dynamic memory was fundamentally a single mode. Moreover, the dynamic memory was constructed of a single internal bank.

On the other hand NIKKEI ELECTRONICS, 1992. 5.11 (No. 553), pp. 143–147 introduces, as a dynamic memory being accessible at a twice or 4 times higher speed than before, a synchronous dynamic memory having a plurality of banks and a built-in register which can set the operation mode of these banks (such as delay from /RAS transition or /CAS transition, the number of words accessible sequentially (wrap length), and the order of addresses of input/output data pieces which are accessed sequentially).

SUMMARY OF THE INVENTION

In the processor system in which the main storage apparatus is constructed of general purpose dynamic memories without a clock input as described above, it is impossible to input a clock signal directly to the respective dynamic memory chips and cause each chip to be operated in synchronism with the clock signal.

Accordingly, control signals for the general purpose dynamic memory must be prepared externally of the chip at a timing which meets an AC characteristic of the chip, on the basis of a system clock of the processor system.

Inside the general purpose dynamic memory, on the other hand, an internal operation clock was also generated from the control signal to ensure control of the internal operation. Consequently, in the processor system using general purpose dynamic memories, the overhead covering the system clock up to the internal operation clock was increased, making it difficult to construct a main storage apparatus capable of operating at a high speed in synchronism with the system clock.

Further, in the processor system in which the main storage apparatus was constructed of general purpose dynamic memories of the single mode type not incorporating a mode register for prescribing the operation mode of the dynamic memory, the main storage needed to be set up so as to comply with a mode of the general purpose dynamic memory and it was difficult from the standpoint of performance and costs to construct a main storage apparatus which is optimized for the processor system.

Furthermore, in the processor system in which the main storage apparatus was constructed of general purpose dynamic memories incorporating a single bank, in order for the main storage apparatus to incorporate a plurality of banks, a plurality of general purpose dynamic memories were needed correspondingly and it was difficult from the standpoint of performance and costs to construct a main storage apparatus which is optimized for the processor system.

Under the circumstances, by using in the main storage apparatus a synchronous dynamic memory having a plurality of banks and a built-in register which can set the operation mode of the dynamic memory, the above problems can be solved.

On the other hand, the conventional processor premises that the main storage apparatus is constructed of general purpose dynamic memories incorporating a single bank. Therefore, if a synchronous dynamic memory having a plurality banks and whose operation mode is set by a built-in register is practically used in the main storage apparatus, then there arises a problem that both the conventional processor and the synchronous dynamic memory lack concrete means to realize control of access to the plurality of banks and control of setting of an operation mode to the built-in register. If the concrete means is arranged in any of the conventional processor and the synchronous dynamic memory, there arises a problem that the processor or the synchronous dynamic memory cannot have compatibility with a wide range of applications.

An object of the present invention is to solve the above problems and provide a processor system having a main storage apparatus which can be optimized from the standpoint of performance and costs.

To accomplish the above object, a processor according to a typical embodiment of the present invention comprises:
 a processor (MPU);
 a main storage apparatus (MS) accessible by an address from the processor (MPU); and
 a main storage controller (MC) coupled to the processor and the main storage apparatus,
 the main storage apparatus (MS) is a memory (501) having a plurality of memory banks (502, 503) and a mode register (505) for determining an operation mode, and
 the main storage controller (104) includes:
 a register control unit (702) for detecting that the address from the processor (MPU) accesses the mode register (505) of the memory (501) and transferring setting information, occurring upon the accessing, to the mode register (505) of the memory (501) in response to a result of detection;
 address registers (705a, 705b) for storing at least two consecutive preceding and succeeding access addresses from the processor (MPU);
 a bank field comparator (714) for comparing parts of information about bank fields of two respective access addresses stored in the address registers, and
 a memory access control unit (707) for delivering a bank operation start signal (/RAS0, /RAS1) for requesting parallel operations of two accesses corresponding to the two access addresses, in response to an output of the bank field comparator (714) when the bank field information parts are different from each other. In a preferred embodiment form of the present invention, the processor (MPU) and the main storage controller (104) are individual chips.

In another preferred embodiment of the present invention, the processor (MPU) and the main storage controller (104) are respectively formed of independent cores inside the same chip.

Further, in a concrete embodiment of the present invention, when the bank field information parts of the two access addresses are different from each other during preceding and succeeding accesses, during read operation of data by the preceding access from one (502) of the plurality of memory banks (502, 503) of the memory (501), access by the succeeding access to the other (503) of the plurality of memory banks (502, 503) of the memory (501) is initiated.

In a more concrete embodiment of the present invention, the memory (501) is a synchronous dynamic memory which operates in synchronism with a clock signal applied to its clock input terminal.

Thus, in accordance with the typical embodiment of the present invention, since the means to realize controlling of access to a plurality of banks of the memory (MS) and controlling of setting of an operation mode to the built-in register is arranged in the main storage controller (MC) coupled to the processor (MPU) and the main storage apparatus (MS), the use of a conventional general purpose processor and a conventional general purpose memory can be ensured.

Further, in a preferred embodiment of the present invention, the processor (MPU) and the main storage controller (104) are respectively formed of separate chips and therefore the use of the conventional general purpose processor and the conventional general purpose memory chip can be ensured by adding the main storage controller (MC).

Further, in another preferred embodiment of the present invention, the processor (MPU) and the main storage controller (104) are respectively formed of independent cores inside the same chip and therefore the use of the conventional general purpose processor core and the conventional general purpose memory chip can be ensured by adding a core of the main storage controller (MC) into the same chip.

Other objects and features of the present invention will become apparent from embodiments to be described hereinafter.

BRIEF DESCRIPTION OF THE DRAWINGS

FIGS. 5A and 5B are diagrams showing an internal architecture of a synchronous dynamic memory and a field organization of a command register included in the synchronous dynamic memory.

FIG. 9 is a time chart of mode setting and refresh cycle.

FIG. 10 is a time chart of two read block transfer cycles.

DESCRIPTION OF THE PREFERRED EMBODIMENTS

An embodiment of the present invention will be described hereunder with reference to the drawings.

Overall Architecture of Processor System

Figure 1:
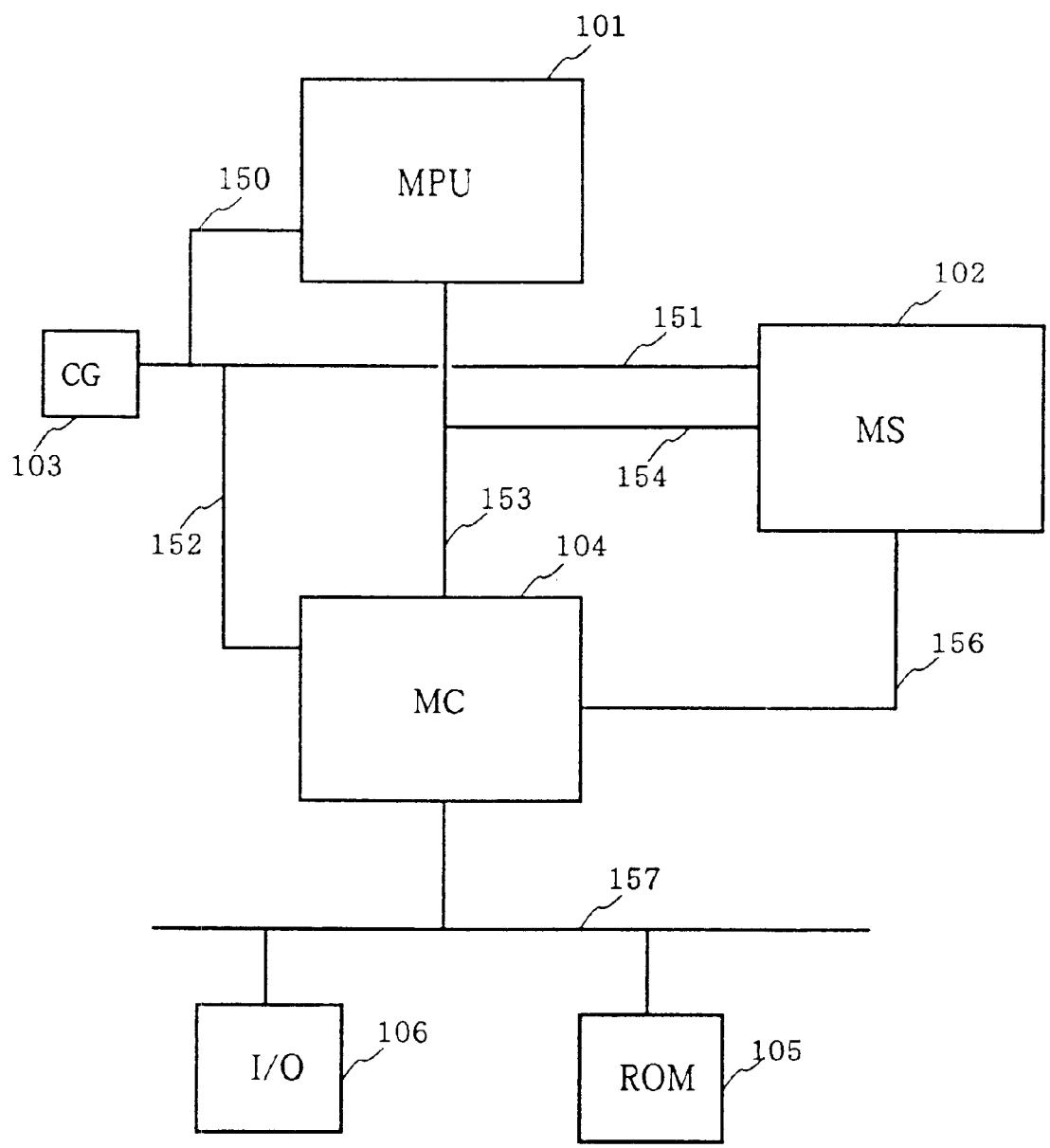
FIG. 1 is a diagram showing an architecture of a processor system according to an embodiment of the present invention.

FIG. 1 is a diagram showing a construction of a processor system.

Reference numeral 101 designates a microprocessor unit (hereinafter abbreviated as MPU) constructed of a single chip.

Reference numeral 102 designates a main storage apparatus (hereinafter abbreviated as MS) which includes a plurality of synchronous dynamic memory chips.

Reference numeral 104 designates a controller for MS 102 which is constructed of a single chip.

Reference numeral 103 designates a clock generator (hereinafter abbreviated as CG) of the processor system. The CG 103 supplies clock signals 150, 151 and 152 to the MPU 101, the MS 102 and the MC 104. These clock signals are synchronous with each other. In the present embodiment, 150, 151 and 152 are clock signals which are in synchronism with each other at the same frequency. However, the relation between 150 and 151 and the relation between 150 and 152 may be allowed to be 1:N (N being integer) or N:1. Denoted by 150, 151 and 152 are signals which are synchronous with each other. Therefore, the individual components of the processor system operate in synchronism with a single system clock.

Reference numeral 153 designates a processor bus through which the MPU 101 and the MC 104 are coupled together and which consists of address, data and control signal lines. Of them, a data bus 154 is also coupled to the MS 102. Through this data bus 154, data from the MS 102 is transmitted directly to the MPU 101.

Reference numeral 156 designates addresses and control signal which are supplied from the MC 104 to the synchronous dynamic memory MS 102.

The MC 104 is also coupled to an I/O bus 157. Coupled to this I/O bus 157 are an I/O device 106 and a read only memory (hereinafter abbreviated as ROM) 105 in which initial program loading, operation system boot and a system initializing program are stored.

Internal Architecture of MPU and Processor Bus

Figure 2:
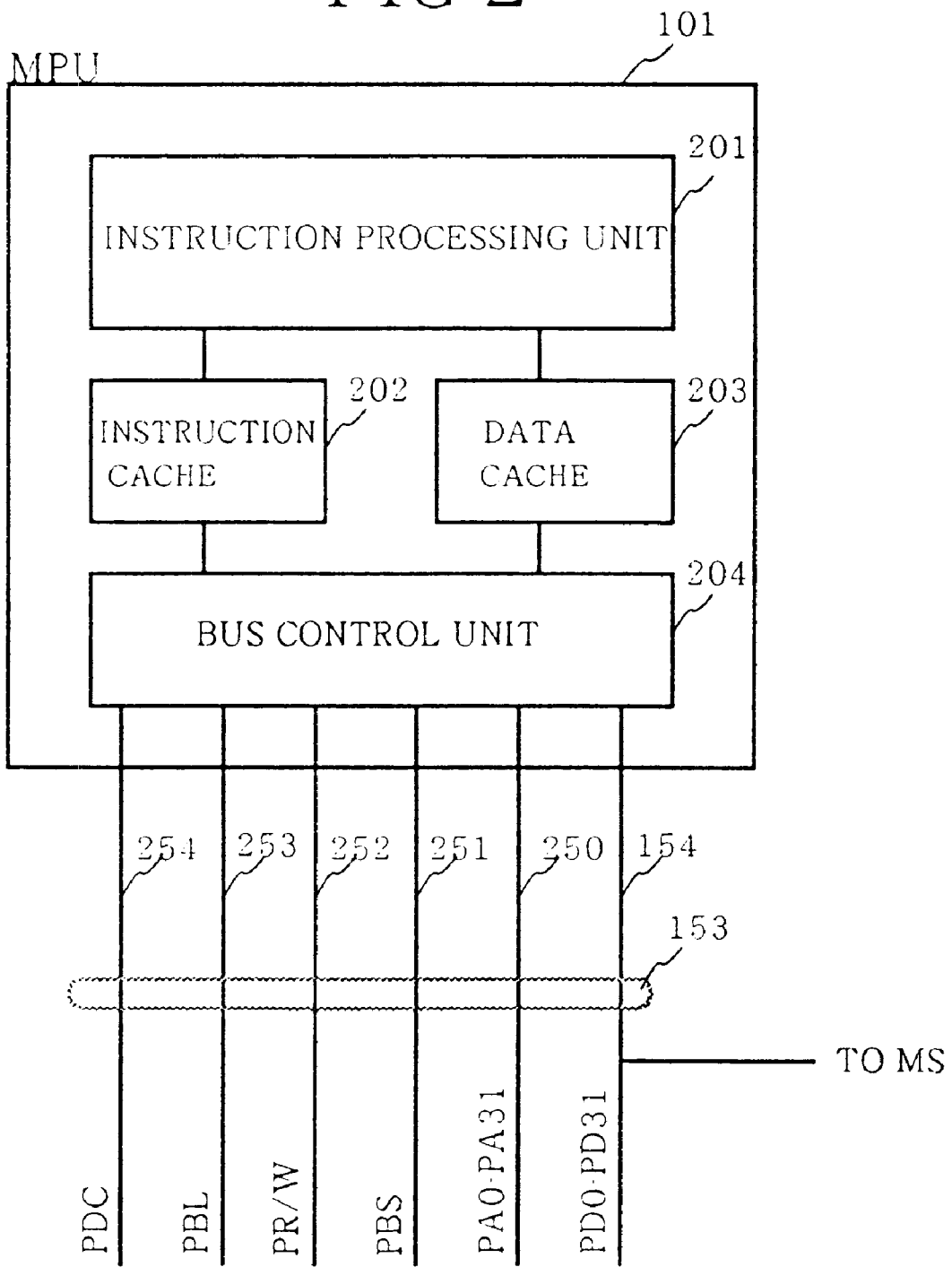
FIG. 2 is a diagram showing an internal architecture of an MPU.

FIG. 2 shows an internal architecture of the MPU 101 and breakdown of the processor bus 153. An instruction processing unit 201 is a unit which decodes an instruction and performs, on the basis of decoded information, such processings as an operation, fetch of data (operand), and store of data and branch. Denoted by 202 is an instruction cache for storing instructions temporarily and supplying the instructions at a high speed in accordance with a request from the instruction processing unit 201. Denoted by 203 is a data cache for storing data temporarily and supplying the data at a high speed in accordance with a request from the instruction processing unit 201. The block length of the cache is 16 bytes in both the instruction cache 202 and the data cache 203. Namely, since the processor bus 153 has a data width of 4 bytes, 16 bytes of a block timed to occurrence of a cache miss is divided by four and successive transfer from the MS 102 to each division of the cache is carried out. Denoted by 204 is a bus control unit for controlling the processor bus. The bus control unit 204 responds to a request from the instruction cache 202, data cache 203 or instruction processing unit 201 to start the processor bus 153 in order that a necessary instruction and necessary data are fetched from the outside or transferred to the outside.

Breakdown of the processor bus 153 is as follows.

PD0–PD31 (154): Data bus of 4-byte width. Input/output signal. The data bus 154 is coupled directly to the MS 102. PD0 is the most significant bit and PD31 is the least significant bit.

PA0–PA31 (250): Address bus of 32-bit width, permitting 4-gigabyte addressing. Output signal. PA0 is the most significant bit and PA31 is the least significant bit.

PBS (251): Bus start signal. Output signal.

PR/W (252): Read/write request signal. During H, read and during L, write. Output signal.

PBL (253): Block transfer request. Output signal.

PDC (254): Transfer ending. Input signal.

Area Assignment in Processor Bus Space

Figure 3:
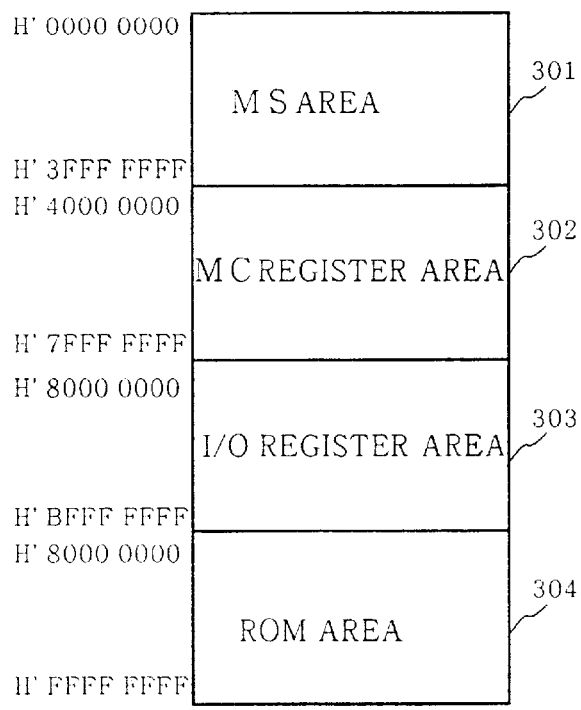
FIG. 3 is a diagram showing area assignment in a processor bus space.

In the present system, a 4-gigabyte space addressable through PA0–PA31 (250) is divided into four areas as shown in FIG. 3 in accordance with the upper two bits of the addresses.

MS area (301): Area to which the MS 102 is assigned.

MC register area (302): Area to which an internal register of the MC 104 is assigned.

I/O register area (303): Area to which an internal register of the I/O device 106 is assigned.

ROM area (304): Area to which the ROM 105 is assigned.

Internal Assignment in MS Area and MC Register Area

Figure 4:
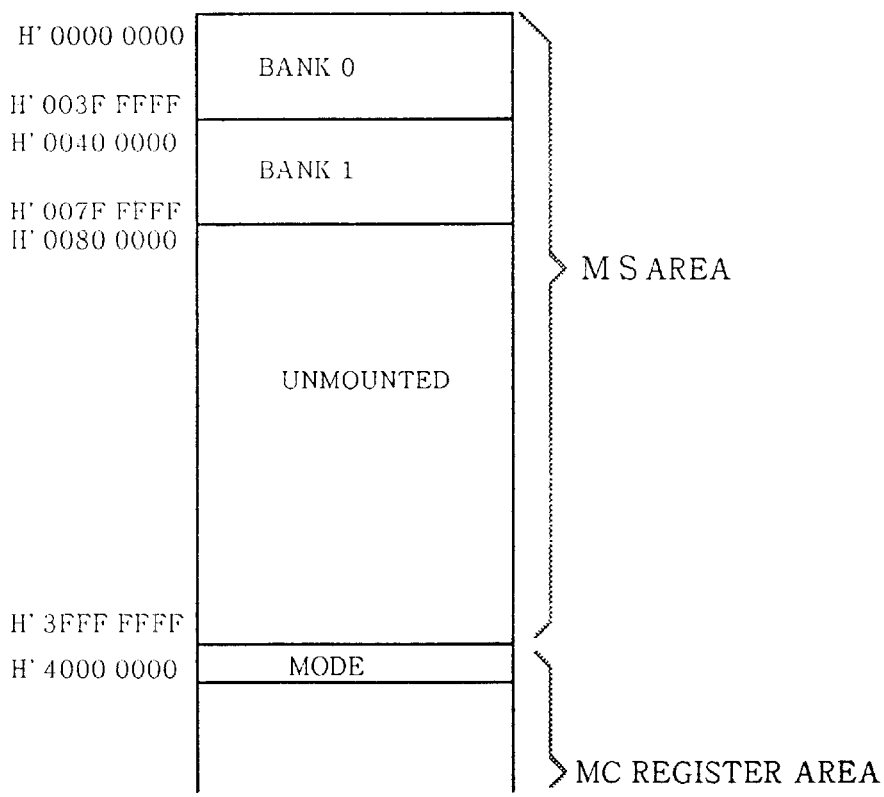
FIG. 4 is an illustrative diagram of an MS area and an MC register area.

FIG. 4 shows internal assignment in the MS area 301 and the MS register area 302. An area between H'00000000 and H'003FFFFF is a sub-area for bank 0. This bank corresponds to one of the banks inside the synchronous dynamic memory. An area between H'0040000 and H'007FFFFF is a sub-area for bank 1. This bank corresponds to the other bank inside the synchronous dynamic memory. Assigned to an address H'40000000 of the MC register area 302 is a MODE register of 8-bit length. When the MPU 101 writes a suitable value in this MODE register, the value is set in a mode register inside the synchronous dynamic memory and an operation mode of thereof is determined.

Internal Architecture of Synchronous DRAM

FIG. 5A shows an internal architecture of a synchronous dynamic memory 501 in a single chip for formation of the MS 102. The MS 102 is comprised of four of the above chips. The memory of this chip has two memory banks which are a bank 0 (502) and a bank 1 (503). Each memory bank is of 1,048,576 words×8 bits. Therefore, the whole chip has a capacity of 16M bits (=8M bytes). Denoted by RFADR 504 is an address counter adapted to prepare a row address for refresh. Denoted by CMR 505 is a mode register for determining an operation mode of the chip 501. Denoted by 506 is an internal control circuit for the chip 501. This circuit responds to control signals from the outside of the chip and a value set in the CMR 505 to prepare an internal operational signal in synchronism with a clock signal inputted externally of the chip.

Interface Signals of Synchronous DRAM

Interface signals of the synchronous dynamic memory are as follows.

A0–A10 (550): Address signal. Input. A row address and a column address are inputted. Used as a row address are 11 bits of A0–A10. Used as a column address are 9 bits of A0–A8. During inputting of a column address, A10 is used for bank designation. During setting of the CMR 505, mode information is inputted through A0–A7.

I/O0–I/O7 (551): Data signal. Input/output. Interface for data signal during read/write.

CLK (552): Clock signal. Input. In synchronism with a rising edge of this signal, a value on an input signal to the chip is fetched internally thereof. Or, in synchronism with a rising edge of this signal, an output is transmitted externally of the chip.

/WE (553): Write enable signal. Input. Asserted (Low level, hereinafter referred to as L) when requesting data write.

/CAS (554): Column address strobe signal. Input. Asserted (L) when supplying a column address.

/RAS0, /RAS1 (555): Row address strobe signal. Input. Asserted (L) when supplying a row address. This signal corresponds to the respective banks and constitutes an operation start signal of each bank.

/DQM (556): Data mask signal. Input. During read, this signal behaves as an enable signal for the output I/O0–I/O7 (551). Unless this signal is asserted (L) during read, the output 551 remains at a high impedance state. During write, this signal behaves as a write enable signal. During write, with this signal asserted (L), data is written actually.

Field Organization of Mode Register

FIG. 5B shows a field organization of the CMR 505 and the contents thereof. An RL field, a CL field and a WL field are respectively associated with addresses defined by bits A0–A2, A3–A4 and A5–A7 and during mode setting, each of the fields fetches values on corresponding address bits. The RL field indicates an /RAS delay. For example, if 100 is set here, data is read out during the read operation 4-clock after the /RAS has been asserted. The CL field indicates a /CAS delay. For example, if 10 is set here, data is read out during the read operation 2-clock after the /CAS has been asserted. The WL field indicates a wrap length. This chip has the function to sequentially read, in synchronism with the clock, data pieces on a row designated by the same row address, beginning with a site designated by a column address. At that time, the column address is wrapped around at a length designated by the WL field. For example, if 000 is designated by the WL field, the wrap length becomes 4 and wraparound of 0-1-2-3, 1-2-3-0, 23-0-1 and 3-0-1-2 proceeds.

Architecture of Main Storage

Figure 6:
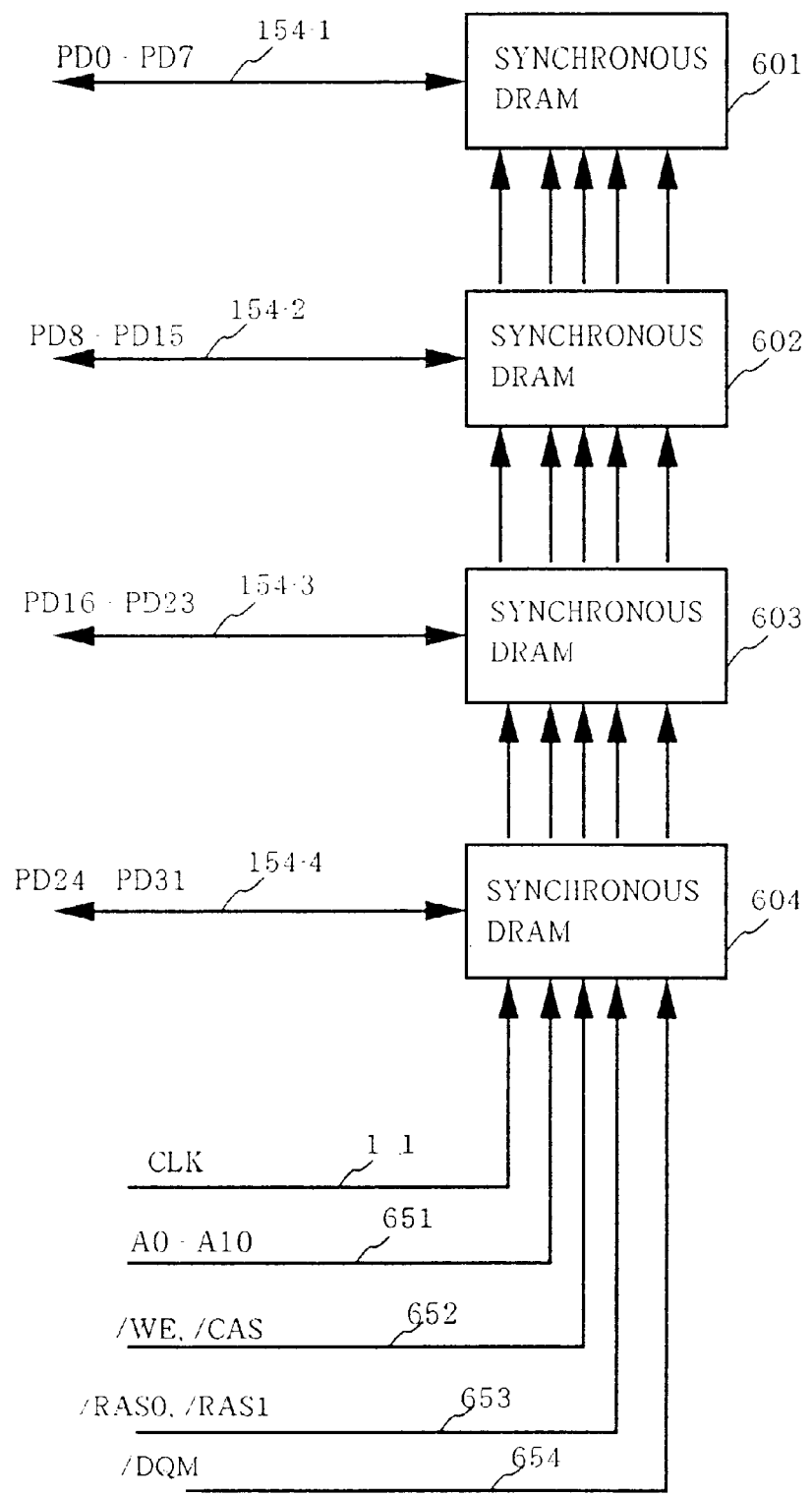
FIG. 6 is a diagram showing an architecture of a main storage apparatus (MS).

FIG. 6 shows an architecture of the MS 102 using four (601, 602, 603 and 604) synchronous dynamic memories

501. 8-bit data signals of individual chips are coupled to respective byte positions of the data bus 154. The clock signal 151 connects to the CLK 552 of each chip, and A0–A10 (651), /WE, /CAS (652), /RAS0, /RAS1 (653) and /DQM (654) connect to corresponding input signals which are common to the respective chips. Denoted by 651, 652, 653 and 654 are output signals from the MC 104.

Figure 7:
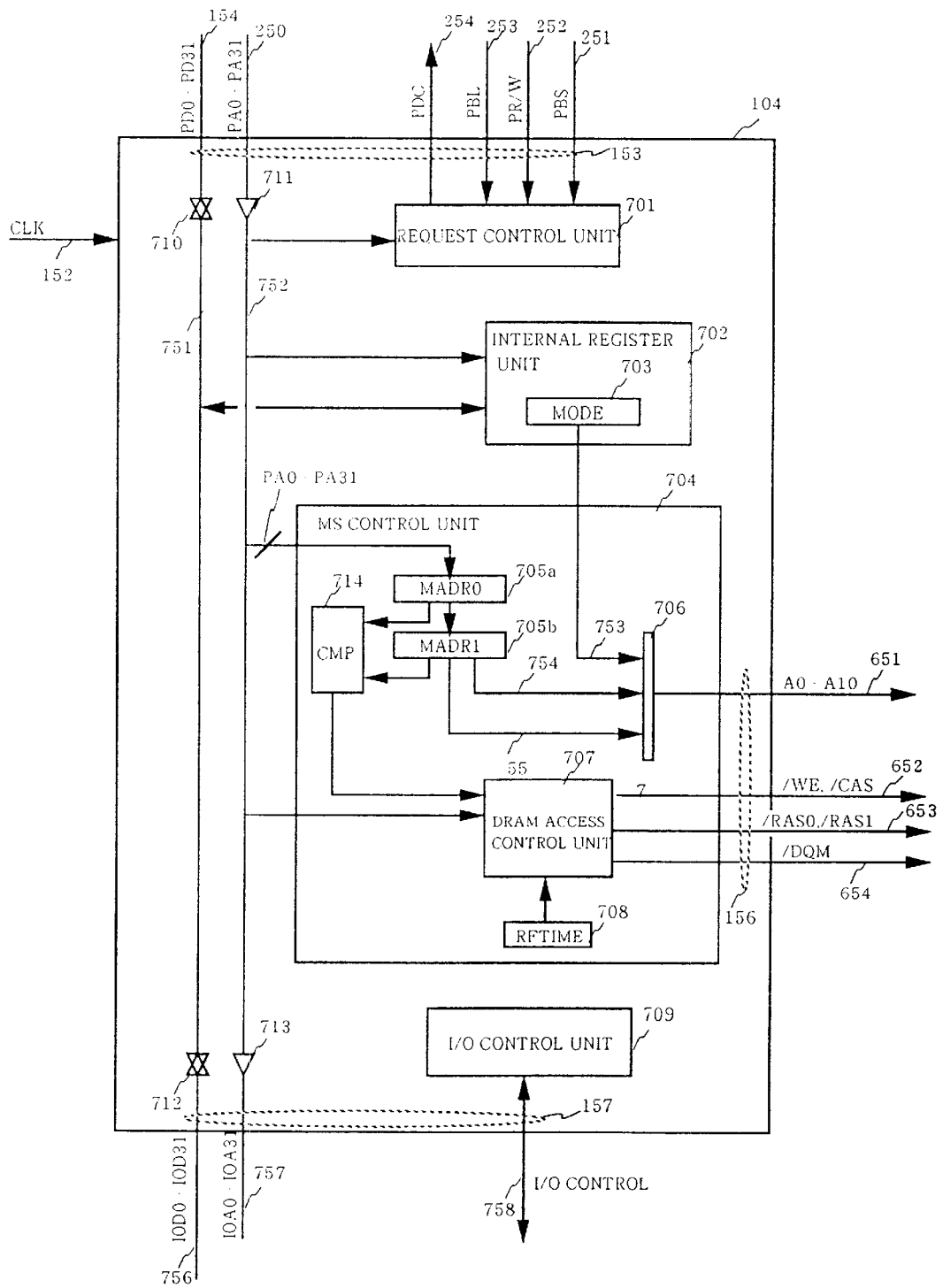
FIG. 7 is a diagram showing an internal architecture of a main storage controller.

Internal Architecture of Main Storage Controller and Bit Assignment to Row, Column and Bank FIG. 7 shows an internal architecture of the MC 104. The internal architecture is comprised of a request control unit 701, an internal register control unit 702, an MS control unit 704 and an I/O control unit 709. The request control unit 701 analyzes the two upper address bits of a bus cycle issued from the MPU 101 onto the processor bus 153 to decide which of the MS area 301, MS register area 302, I/O register area 303 and ROM area 304 the bus cycle is destined for and then transfers control to a corresponding control unit.

Provided in the internal register control unit 702 are control registers included in the MC 104. One of them is a MODE register 703 for determining an operation mode of the synchronous dynamic memory. The internal register control unit 702 watches for an address signal on the address bus PA0–PA31 (250) to detect that an address from the processor 101 accesses the mode register 505 of the synchronous dynamic memory 501, and responsive to a result of this detection, it transfers setting information (information from the data bus PD0–PD31 (154)) during this accessing to the mode register 505 of the synchronous dynamic memory 501. More particularly, when a value from the MPU 101 is written in this MODE register 703, the internal register control unit 702 sends an indication to the MS control unit 704 and sends information written in the MODE register 703 to the A0–A7 lines 651 through a selector 706 to execute a write cycle to the CMR 505 of the synchronous dynamic memory 501.

The MS control unit 704 controls an address signal A0–A10 (651) of a synchronous dynamic memory 501 constituting the MS 102, and a DRAM access control unit 707 generates control signals /WE, /CAS (652), /RAS0, /RAS1 (653) and /DQM (654).

Denoted by MADR0 (705*a*) and MADR1 (705*b*) are registers for holding access addresses of bus cycles issued from the MPU 101 to the MS area. The two registers are constructed in the form of a FIFO (first in first out). An address of a preceding bus cycle is latched in the MADR1 (705*b*) and an address of a succeeding bus cycle is latched in the MADR0 (705*a*). As holding of the address of the preceding bus cycle becomes unneeded, the contents of the MADR0 (705*a*) are shifted to the MADR1 (705*b*). The contents of 705*b* are divided into a row address field, a column address field and a bank field.

Figure 8A:
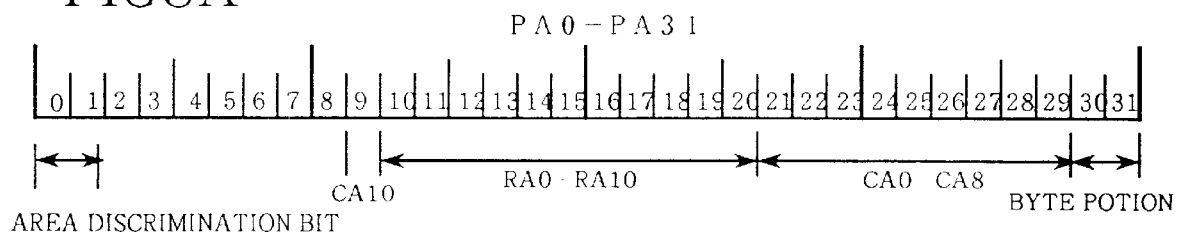
FIGS. 8A and 8B are diagrams showing examples of bit assignment of row, column and bank addresses.

The bit position of each field is shown in FIG. 8A. The 9-th bit represents the bank field CA10, the 10-th to 20-th bits represent the row address field RA0–RA10, and the 21st to 29-th bits represent the column address field CA0–CA8.

When the MS control unit 704 transmits a row address, the RA0–RA10 is transferred to the A0–A10 (651) by means of the selector 706.

When the MS control unit 704 transmits a column address, the CA0–CA8 is transferred to the A0–A8 (651) by means of the selector 706 and, at the same time, the bank field CA10 is transferred to the A10 line (651).

Denoted by CMP 714 is a comparator for comparing bank fields in the MADR0 (705*a*) and MADR1 (705*b*). When a comparison results in coincidence, accesses are destined for the same bank and therefore two cycles of one synchronous dynamic memory cannot be operated in parallel. But when a comparison results in non-coincidence, indicating that accesses are destined for different banks and therefore parallel operations of two cycles are permitted, the DRAM control 707 generates a control signal (/RAS0, /RAS1) which enables the parallel operations. This improves the throughput of the MS 102.

Denoted by RFTIME 708 is a refresh timer. This timer issues a refresh request to the DRAM control 707 at constant time intervals in order to cause it to execute a refresh cycle of the synchronous dynamic memory 501.

The I/O control unit 709 generates an I/O control signal 758 for controlling a bus cycle on the input/output bus 157.

Figure 8B:
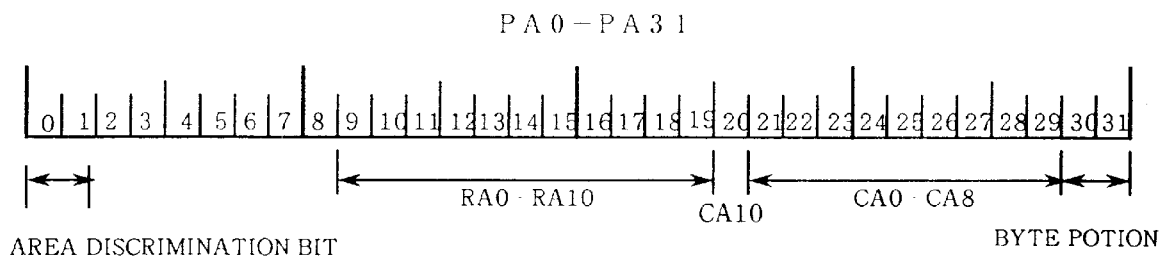

Apart from the present embodiment, bit assignment to a row address field, a column address field and a bank field can be effected as shown in FIG. 8B.

During initial operation of this processor system, an initial operation program is read out of the ROM 105 and executed. In this program, mode setting of the synchronous dynamic memory 501 is first carried out.

During Initial Operation of Processor System

A time chart in this phase is shown in FIG. 9. The MPU 101 issues onto the processor bus 153 an address MA of the MODE register 703 included in the MC 104 and a write bus cycle of a mode setting value MD (clocks 2–4). In response thereto, the MS control unit 704 of the MC 104 asserts /RAS0, /RAS1, ICAS and /WE for the MS 102 and passes a set value to the A0–A7, thereby issuing a mode setting cycle. Through this, the mode setting of all of the synchronous dynamic memories 501 can be accomplished (clock 5). Indicated at a clock 10 is a refresh cycle. This is executed by asserting /RAS0, /RAS1 and /CAS.

Parallel Operations of Two Accesses in Two Different Memory Banks

FIG. 10 shows a case of two read block transfer cycles. In this case, /RAS delay is 4 clocks, /CAS delay is 1 clock and the wrap length is 4. At clocks 2 and 6, read block transfer cycle (with PBL asserted) requests are issued from the MPU 101. This issuance is done in the event that, for example, the internal cache of the MPU 101 misses. The preceding block transfer cycle is for the bank 0 and therefore, /RAS0 is asserted for the MS 102 at clock 3 to start the bank 0. Concurrently therewith, a row address Ar is passed through the A0–A10. At clock 6, /CAS is asserted and at the same time, a column address Ac is passed. In order to pass read data to data bus PD0–PD31, /DQM is started to be asserted at clock 7. One block read data of 4 words, that is, A, A+1, A+2 and A+3 are sequentially read in synchronism with clocks 8, 9, 10 and 11. During read-out of this one block, start of a succeeding bus cycle (access to the bank 1) is initiated (/RAS1 is asserted at clock 8) and data for this, that is, B, B+1, B+2 and B+3 are sequentially read during 4 clocks which begin with clock 13. By asserting PDC, the MPU 101 can be informed of arrival of read data.

Figure 11:
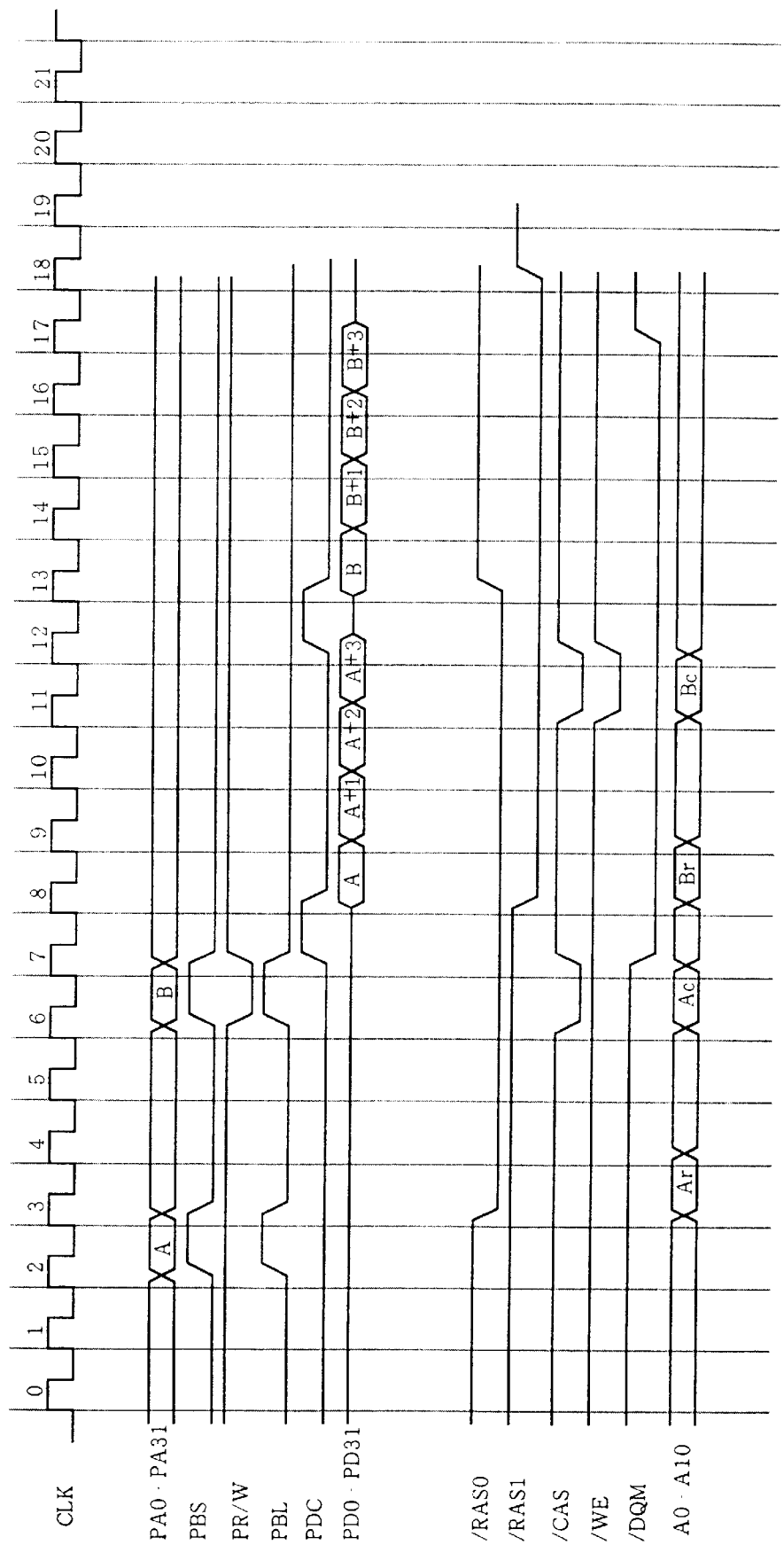
FIG. 11 is a time chart of a read block transfer cycle/write block transfer cycle.

FIG. 11 shows a case where after a read block transfer cycle of data A, A+1, A+2 and A+3, a write block transfer cycle of data B, B+1, B+2 and B+3 is issued. In this case, the /RAS delay is 4 clocks, the /CAS delay is 1 clock and the wrap length is 4. At clock 6, a write block transfer cycle (PR/WL=L) request is issued from the MPU 101. This issuance is done in the event that, for example, the internal cache of the MPU 101 misses. The preceding block transfer cycle is for the bank 0 and therefore, /RAS0 is asserted for the MS 102 at clock 3 to start the bank 0. Concurrently therewith, a row address Ar is passed through the A0–A10. At clock 6, /CAS is asserted and at the same time, a column address Ac is passed. In order to pass read data to data bus PD0–PD31, /DQM is started to be asserted at clock 7. The read data is sequentially read in synchronism with clocks 8, 9, 10 and 11. During readout of this data, start of a succeeding bus cycle (access to the bank 1) is initiated (/RAS1 is asserted at clock 8) and when PDC is asserted at clock 12, the MPU 101 sequentially delivers data onto the data bus PD0–PD31 during 4 clocks which begin with clock 13.

Since the parallel operations of the two banks can be permitted as shown in FIGS. 10 and 11, the main storage apparatus of high throughput can be constructed.

Other Embodiments

The present invention has been described by way of example but the invention is in no way limited to the foregoing specified embodiments and may obviously be modified in various ways within the scope of the fundamental technical idea of the present invention. For example, the following embodiment can be adopted in accordance with the present invention.

Figure 12:
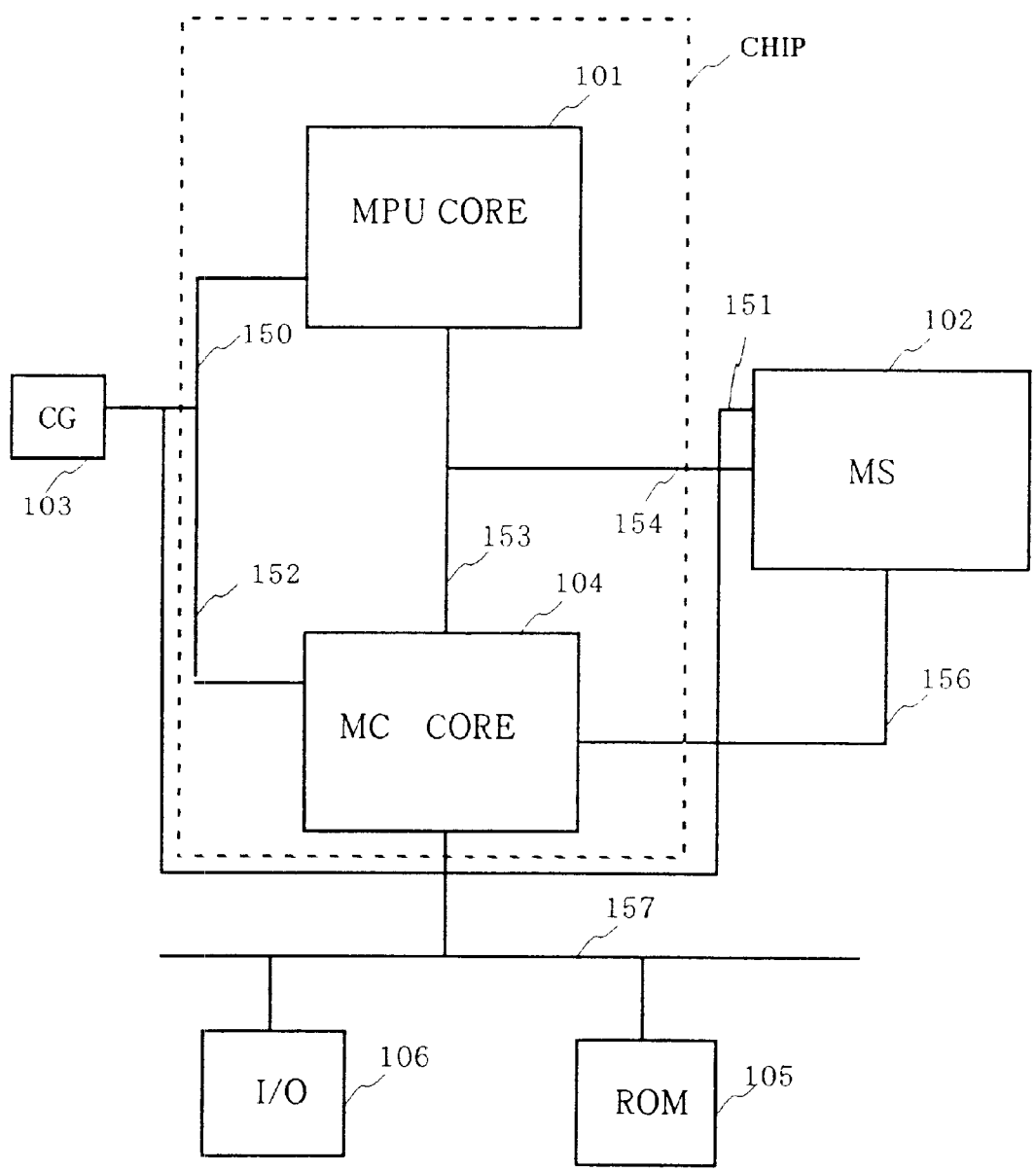
FIG. 12 is a diagram showing an architecture of a processor system according to another embodiment of the present invention.

FIG. 12 is a diagram showing the architecture of a processor system according to another embodiment of the invention, and this embodiment differs from the embodiment of FIG. 1 in that a processor (MPU) and a main storage controller (104) are respectively formed of independent cores inside the same chip. Accordingly, by adding the core of the main storage controller (MC) into the same chip, the use of the conventional general purpose processor core and the conventional general purpose memory chip can be ensured.

As has been described, according to the typical embodiment of the present invention, means to realize controlling of access to a plurality of banks of the memory (ms) and controlling setting of an operation mode to a built-in register is arranged in the main storage controller (mc) coupled to the processor (mpu) and the main storage apparatus (ms), and therefore the use of the conventional general purpose processor and the conventional general purpose memory can be ensured.

What is claimed is:

1. A processor system comprising:
    a memory having a mode register for identifying an operation mode, wherein said memory operates in synchronism with a first clock signal generated externally from said memory, said memory formed on a single chip; and
    a data processor formed on a single chip, wherein said data processor operates in synchronism with a second clock signal,
    wherein said data processor includes:
        a microprocessor; and
        a control unit coupled to said microprocessor and said memory;
            wherein said control unit transfers command information to input terminals of said memory;
    wherein said first clock signal is in synchronism with said second clock signal.

2. A processor system according to claim 1, wherein said command information includes a mode register set function which transfers mode information to said mode register.

3. A processor system according to claim 2, wherein said command information includes a refresh function which requests a refresh to said memory.

4. A processor system according to claim 3, wherein said control unit asserts a row address strobe signal and a column address strobe signal, and negates a write enable signal when said refresh function is requested.

5. A processor system according to claim 1, wherein said command information includes a bank access function which provides a request to said memory for initiating a bank.

6. A processor system according to claim 5, wherein a row address is applied to address signal input terminals of said memory with an asserting of a row address strobe signal, and negating a column address strobe signal by said control unit when said bank function is requested.

7. A processor system according to claim 1, wherein said command information includes a write function which provides a request to said memory for writing data.

8. A processor system according to claim 7, wherein a column address is applied to address signal input terminals of said memory with an asserting of a column address strobe signal and a write enable signal by said control unit when said write function is requested.

9. A processor system comprising:
    a memory having a plurality of memory banks and a mode register for identifying an operation mode, wherein said memory operates in synchronism with a clock signal generated externally from said memory;
    a microprocessor providing operation mode information to be stored in said mode register of said memory; and
    a control unit coupled to said microprocessor and said memory, said control unit transferring said operation mode information to said mode register of said memory and operates in synchronism with said clock signal;
    wherein said microprocessor and said control unit are provided as mutually separate individual chip areas on a same semiconductor chip.

10. A processor system comprising:
    a memory having a mode register for identifying an operation mode, wherein said memory operates in synchronism with a clock signal generated externally from said memory, wherein said memory is formed on a single chip;
    a microprocessor providing operation mode information to be stored in said mode register of said memory; and
    a control unit coupled to said microprocessor and said memory, said control unit transferring said operation mode information to said mode register of said memory and operates in synchronism with said clock signal;
    wherein said microprocessor and said control unit are provided as mutually separate individual chip areas on a same semiconductor chip.

11. A processor system comprising:
    a memory having a mode register for identifying an operation mode wherein said memory operates in synchronism with a clock signal generated externally from said memory;
    a microprocessor providing operation mode information to be stored in said mode register of said memory; and
    a control unit coupled to said microprocessor and said memory, said control unit transferring said operation mode information to said mode register of said memory and operates in synchronism with said clock signal;
    wherein said microprocessor and said control unit are provided as mutually separate individual chip areas on a same semiconductor chip.

12. A processor system comprising:
a memory having a mode register for identifying an operation mode, wherein said memory operates in synchronism with a first clock signal generated externally from said memory, said memory formed on a single chip; and
a data processor operating in synchronism with a second clock signal,
wherein said data processor includes:
a microprocessor formed on a second chip; and
a control unit formed on a third chip and coupled to said microprocessor and said memory;
wherein said control unit transfers command information to input terminals of said memory;
wherein said first clock signal is in synchronism with said second clock signal.

13. A processor system according to claim 12, wherein said command information includes a mode register set function which transfers mode information to said mode register.

14. A processor system according to claim 13, wherein said mode information is applied to address signal input terminals of said memory with an asserting of a row address strobe signal, column address strobe signal and a write enable signal by said control unit.

15. A processor system according to claim 14, wherein said control unit transfers said operation mode information to said memory when said microprocessor unit accesses a predetermined address area in an address space of said microprocessor unit.

16. A processor system according to claim 15, wherein said command information includes a refresh function which requests a refresh to said memory.

17. A processor system according to claim 16, wherein said control unit asserts a row address strobe signal and a column address strobe signal, and negates a write enable signal when said refresh function is requested.

18. A processor system according to claim 15, wherein said command information includes a bank access function which provides a request to said memory for initiating a bank.

19. A processor system according to claim 18, wherein a row address is applied to address signal input terminals of said memory with an asserting of a row address strobe signal, and negating a column address strobe signal by said control unit when said bank function is requested.

20. A processor system according to claim 12, wherein said command information includes a write function which provides a request to said memory for writing data.

21. A processor system according to claim 20, wherein a column address is applied to address signal input terminals of said memory with an asserting of a column address strobe signal and a write enable signal by said control unit when said write function is requested.

22. A processor system comprising:
a memory having a plurality of memory banks and a mode register for identifying an operation mode, wherein said memory operates in synchronism with a clock signal generated externally from said memory;
a microprocessor providing operation mode information to be stored in said mode register of said memory; and
a control unit coupled to said microprocessor and said memory, said control unit transferring said operation mode information to said mode register of said memory and operates in synchronism with said clock signal;
wherein said memory, said microprocessor and said control unit are provided as mutually separate individual semiconductor chips.

23. A processor system comprising:
a memory having a mode register for identifying an operation mode wherein said memory operates in synchronism with a clock signal generated externally from said memory;
a microprocessor providing operation mode information to be stored in said mode register of said memory; and
a control unit coupled to said microprocessor and said memory, said control unit transferring said operation mode information to said mode register of said memory and operates in synchronism with said clock signal;
wherein said memory, said microprocessor and said control unit are provided as mutually separate individual semiconductor chips.

24. A processor system comprising:
a memory having a mode register for identifying an operation mode wherein said memory operates in synchronism with a clock signal generated externally from said memory;
a microprocessor providing operation mode information to be stored in said mode register of said memory; and
a control unit coupled to said microprocessor and said memory, said control unit transferring said operation mode information to said mode register of said memory and operates in synchronism with said clock signal;
wherein said memory is provided as a plurality of first semiconductor chips, said microprocessor is provided as a second semiconductor chip, and said control unit is provided as a third semiconductor chip.

25. A processor system comprising:
a memory having a mode register for identifying an operation mode, wherein said memory operates in synchronism with a clock signal generated externally from said memory; and
a data processor,
wherein said data processor includes:
a microprocessor; and
a control unit coupled to said microprocessor and said memory;
wherein said control unit transfers command information to input terminals of said memory and operates in synchronism with said clock signal; and
wherein at least said microprocessor and said controller are formed as separate chip areas on a single semiconductor chip.

26. A processor system according to claim 25, wherein said command information includes a mode register set function which transfers mode information to said mode register.

27. A processor system according to claim 26, wherein said mode information is applied to address signal input terminals of said memory with an asserting of a row address strobe signal, column address strobe signal and a write enable signal by said control unit.

28. A processor system according to claim 27, wherein said control unit transfers said operation mode information to said memory when said microprocessor unit accesses a predetermined address area in an address space of said microprocessor unit.

29. A processor system according to claim 25, wherein said command information includes a refresh function which requests a refresh to said memory.

30. A processor system according to claim 29, wherein said control unit asserts a row address strobe signal and a column address strobe signal, and negates a write enable signal when said refresh function is requested.

31. A processor system according to claim 25, wherein said command information includes a bank access function which provides a request to said memory for initiating a bank.

32. A processor system according to claim 31, wherein a row address is applied to address signal input terminals of said memory with an asserting of a row address strobe signal, and negating a column address strobe signal by said control unit when said bank function is requested.

33. A processor system according to claim 25, wherein said command information includes a write function which provides a request to said memory for writing data.

34. A processor system according to claim 33, wherein a column address is applied to address signal input terminals of said memory with an asserting of a column address strobe signal and a write enable signal by said control unit when said write function is requested.

35. A processor system comprising:

a memory having a mode register for identifying an operation mode wherein said memory operates in synchronism with a clock signal generated externally from said memory;

a microprocessor providing operation mode information to be stored in said mode register of said memory; and a control unit coupled to said microprocessor and said memory, said control unit transferring said operation mode information to said mode register of said memory and operates in synchronism with said clock signal;

wherein at least said microprocessor and said control unit are provided as mutually separate individual chip areas on a same semiconductor chip.

36. A processor system comprising:

a memory having a mode register for identifying an operation mode wherein said memory operates in synchronism with a clock signal generated externally from said memory, wherein said memory is formed on a single chip;

a microprocessor providing operation mode information to be stored in said mode register of said memory; and a control unit coupled to said microprocessor and said memory, said control unit transferring said operation mode information to said mode register of said memory and operates in synchronism with said clock signal;

wherein at least said microprocessor and said control unit are provided as mutually separate individual chip areas on a same semiconductor chip.

37. A processor system comprising:

a memory having a mode register for identifying an operation mode wherein said memory operates in synchronism with a clock signal generated externally from said memory;

a microprocessor providing operation mode information to be stored in said mode register of said memory; and a control unit coupled to said microprocessor and said memory, said control unit transferring said operation mode information to said mode register of said memory and operates in synchronism with said clock signal;

wherein at least said microprocessor is provided as a first semiconductor chip area, and said control unit is provided as a second semiconductor chip area, on a single semiconductor chip.

* * * * *